United States Patent
Yoshitsugu

(10) Patent No.: US 8,729,450 B2
(45) Date of Patent: May 20, 2014

(54) SOLID-STATE IMAGING DEVICE, METHOD OF MANUFACTURING SOLID-STATE IMAGING DEVICE, AND IMAGING APPARATUS

(75) Inventor: Kai Yoshitsugu, Nagasaki (JP)

(73) Assignee: Sony Corporation (JP)

( * ) Notice: Subject to any disclaimer, the term of this patent is extended or adjusted under 35 U.S.C. 154(b) by 260 days.

(21) Appl. No.: 13/402,257

(22) Filed: Feb. 22, 2012

(65) Prior Publication Data

US 2012/0228473 A1    Sep. 13, 2012

(30) Foreign Application Priority Data

Mar. 10, 2011    (JP) ................................ 2011-053237

(51) Int. Cl.
*H01L 27/146*    (2006.01)
(52) U.S. Cl.
USPC ....................................... 250/208.1; 257/432
(58) Field of Classification Search
USPC ............................. 250/208.1, 214.1; 257/431
See application file for complete search history.

(56) References Cited

U.S. PATENT DOCUMENTS

2009/0096049 A1*    4/2009    Oshiyama et al. ............ 257/432

FOREIGN PATENT DOCUMENTS

JP    2010-239116    10/2010

* cited by examiner

*Primary Examiner* — Tony Ko
(74) *Attorney, Agent, or Firm* — Sheridan Ross P.C.

(57) ABSTRACT

There is provided a solid-state imaging device including a semiconductor substrate having an effective region in which a photodiode performing a photoelectric conversion is formed and, an optical black region shielded by a light shielding film; a first film which is formed on the effective region and in which at least one layer or more of layers having a negative fixed charge are laminated; and a second film which is formed on the light shielding region and in which at least one layer or more of layers having a negative fixed charge are laminated, in which the number of layers formed in the first film is different from the number of layers formed in the second film.

7 Claims, 10 Drawing Sheets

SOLID-STATE IMAGING DEVICE, METHOD OF MANUFACTURING SOLID-STATE IMAGING DEVICE, AND IMAGING APPARATUS

BACKGROUND

The present disclosure relates to a solid-state imaging device, a method of manufacturing the solid-state imaging device, and an imaging apparatus.

In a solid-state imaging device of a CCD (Charge Coupled Device) type or a CMOS (Complementary Metal Oxide Semiconductor) type, it is understood that a crystal defect in a photodiode, or an interface state at an interface between a light sensing portion formed in a semiconductor substrate and an insulation layer thereon causes a dark current.

Therefore, as a technology of suppressing the occurrence of the dark current, a technology in which a film having a negative fixed charge is formed on an entire surface of a semiconductor substrate, for example, a light sensing pixel region (hereinafter, referred to as an "effective region") and an optical black region (hereinafter, referred to as an "OB region") is suggested. In this technology, the film having a negative fixed charge is formed on the semiconductor substrate, and a positive charge (hole) is stored in the vicinity of an interface between the light sensing portion and the insulation layer, such that occurrence of the dark current caused by the interface state is suppressed.

Japanese Unexamined Patent Application Publication No. 2010-239116 is an example of the related art.

SUMMARY

However, in regard to the dark current caused by the interface state, an amount of the dark current thereof is different between the effective region and the OB region. Therefore, in a case where the above-described film having a negative fixed charge is formed on the entire surface of the semiconductor substrate, a total amount of dark current decreases, but a difference in the dark current between the effective region and the OB region occurs, such that there is a problem in that a so-called OB difference in level occurs.

It is desirable to provide a solid-state imaging device, a method of manufacturing the solid-state imaging device, and an imaging apparatus, in which the difference between a dark current in an effective region and a dark current in an optical black region may be small and thereby a so-called OB difference in level may be improved.

According to an embodiment of the present disclosure, there is provided a solid-state imaging device including a semiconductor substrate having an effective region in which a photodiode performing a photoelectric conversion is formed and, an optical black region shielded by a light shielding film; a first film which is formed on the effective region and in which at least one layer or more of layers having a negative fixed charge are laminated; and a second film which is formed on the optical black region and in which at least one layer or more of layers having a negative fixed charge are laminated, in which the number of layers formed in the first film is different from the number of layers formed in the second film.

In the solid-state imaging device, the first film may include a first layer that is formed on the semiconductor substrate using an atomic layer vapor deposition method or a metal organic chemical vapor deposition method, a second layer that is formed on the first layer using the atomic layer vapor deposition method or the metal organic chemical vapor deposition method, and a third layer that is formed on the second layer using a physical vapor deposition. The second film may include a first layer that is formed on the semiconductor substrate using the atomic layer vapor deposition method or the metal organic chemical vapor deposition method, and a second layer that is formed on the first layer using the physical vapor deposition.

In addition, in the solid-state imaging device, the first film may include a first layer that is formed on the semiconductor substrate using an atomic layer vapor deposition method or a metal organic chemical vapor deposition method, a second layer that is formed on the first layer using a physical vapor deposition. The second film may include a first layer that is formed on the semiconductor substrate using the atomic layer vapor deposition method or the metal organic chemical vapor deposition method, a second layer that is formed on the first layer using the physical vapor deposition, and a third layer that is formed on the second layer using the atomic layer vapor deposition method or the metal organic chemical vapor deposition method.

In addition, in the solid-state imaging device, the first film may include a first layer that is formed on the semiconductor substrate using an atomic layer vapor deposition method or a metal organic chemical vapor deposition method, a second layer that is formed on the first layer using a physical vapor deposition, and a third layer that is formed on the second layer using the atomic layer vapor deposition method or the metal organic chemical vapor deposition method. The second film may include a first layer that is formed on the semiconductor substrate using an atomic layer vapor deposition method or a metal organic chemical vapor deposition method.

In addition, in the solid-state imaging device, the layers making up the first film and the second film may be formed of any one of a hafnium oxide film, an aluminum oxide film, a zirconium oxide film, a tantalum oxide film, and a titanium oxide film.

According to another embodiment of the present disclosure, there is provided a method of manufacturing a solid-state imaging device. The method includes forming an effective region in which a photodiode performing a photoelectric conversion is formed, and an optical black region shielded by a light shielding film in a semiconductor substrate; forming a first film, in which at least one layer or more of layers having a negative fixed charge are laminated, on the effective region; and forming a second film, in which at least one layer or more of layers having a negative fixed charge are laminated and the number of layers is different from the number of layers formed in the first film, on the optical black region.

According to still another embodiment of the present disclosure, there is provided an imaging apparatus including the solid-state imaging device; an optical system that images an image of a subject on the solid-state imaging device; a driving unit that generates a driving pulse that allows the solid-state imaging device to operate; and a signal processing circuit that processes an output image signal from the solid-state imaging device.

According to the embodiments of the present disclosure, it is possible to make the difference between a dark current in an effective region and a dark current in an optical black region small, and therefore it is possible to improve a so-called OB difference in level.

DETAILED DESCRIPTION OF EMBODIMENTS

Figure 1:
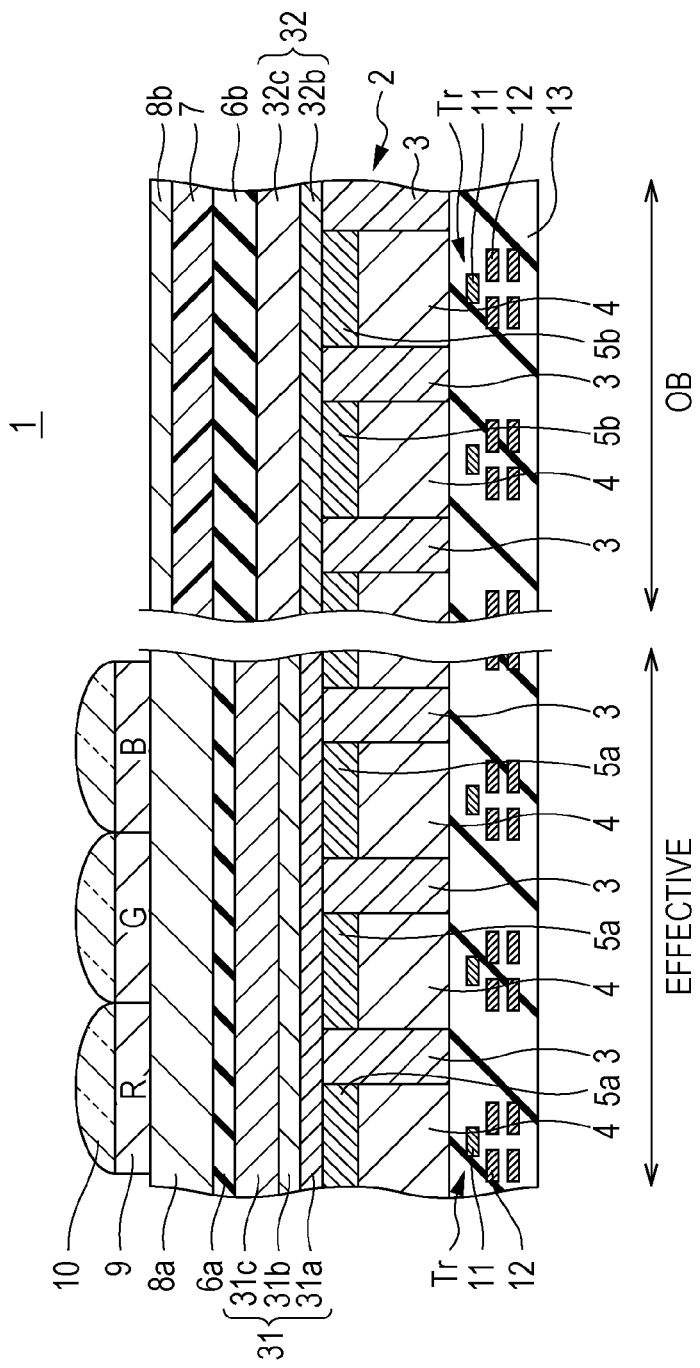
FIG. 1 is a diagram illustrating a cross-sectional structure of a solid-state imaging device according to an embodiment of the present disclosure.

In a solid-state imaging device according to an embodiment of the present disclosure, a first film (hereinafter, referred to as a "first film") having a negative fixed charge is formed on an effective region in which a photodiode is formed in a semiconductor substrate of the solid-state imaging device, and a second film (hereinafter, referred to as a "second film") which has a negative fixed charge and in which the number of laminated layers is different from the first film is formed on an optical black region that is shielded by a light shielding film.

For example, the first film includes a first layer that is formed on the semiconductor substrate, a second layer that is formed on the first layer, and a third layer that is formed on the second layer.

The first layer and the second layer, which make up the first film, are formed by an ALD (Atomic Layer Deposition) method or a MOCVD (Metal Organic Chemical Vapor Deposition) method. In addition, the third layer that makes up the first film is formed by a PVD (Physical Vapor Deposition) method.

In addition, the second film includes, for example, a first layer formed on a semiconductor substrate, and a second layer formed on the first layer. The first layer making up the second film is formed using the ALD method or the MOCVD method. In addition, the second layer making up the second film is formed by the PVD method.

As a material of the layer making up the first film and the second film, for example, oxides such as a hafnium oxide ($HfO_2$), an aluminum oxide ($Al_2O_3$), zirconium oxide ($ZrO_2$), a tantalum oxide ($Ta_2O_5$), and a titanium oxide ($TiO_2$) may be exemplified. Since the layers of these oxides are used for a gate insulation film of an insulation gate-type field effect transistor, or the like, a formation method is established, such that it is possible to easily form the layers.

In addition, among these materials, particularly, in a case where the hafnium oxide (refraction index: 2.05), the tantalum oxide (refraction index: 2.16), the titanium oxide (refraction index: 2.20), or the like, which has a relatively high refraction index, is used, it is also possible to obtain a reflection prevention effect.

As materials other than the above-described materials, for example, each oxide of rare-earth elements may be exemplified. That is, each oxide of lanthanum, praseodymium, cerium, neodymium, promethium, samarium, europium, gadolinium, terbium, dysprosium, holmium, erbium, thulium, ytterbium, lutetium, and yttrium may be exemplified.

Furthermore, a hafnium nitride, an aluminum nitride, a hafnium oxynitride, and an aluminum oxynitride may be used.

Silicon (Si) or nitrogen (N) may be added in the first layer, the second layer, and the third layer that have a negative fixed charge within a range not deteriorating an insulation property. In this case, a concentration of silicon or nitrogen is appropriately determined within a range at which an insulation property of the layers is not deteriorated. In this manner, due to the addition of silicon or nitrogen, heat resistance of respective layers or ion implantation preventing capability during processes may be improved.

The first and second layers making up the first film, and the first layer making up the second film are formed using the ALD method or the MOCVD method as described above. In the case of forming the first film by the ALD method, as conditions, for example, the temperature of a substrate is set to 200 to 500° C., the flow rate of a precursor is set to 10 to 500 sccm, the irradiation time of the precursor is set to 1 to 15 seconds, and the flow rate of $O_3$ is set to 5 to 50 sccm. For example, in the case of forming the first film by the MOCVD method, for example, the temperature of the substrate is set to 200 to 600° C. as a condition.

In addition, in a case where the semiconductor substrate is a silicon layer, and the first layer making up the first film or the first layer making up the second film is formed on the semiconductor substrate by the ALD method, it is possible to form a silicon oxide film, which reduces an interface state, on a surface of the silicon layer with a thickness of substantially 1 nm.

The second layer making up the first film is formed using the ALD method or the MOCVD method as described above. In the case of forming the second layer making up the first film by the ALD method, as conditions, for example, the temperature of a substrate is set to 200 to 500° C., the flow rate of a precursor is set to 10 to 500 sccm, the irradiation time of the precursor is set to 1 to 15 seconds, and the flow rate of $O_3$ is set to 5 to 50 sccm. For example, in the case of forming the second layer making up the first film by the MOCVD method, for example, the temperature of the substrate is set to 200 to 600° C. as a condition.

In addition, the third layer making up the first film and the second layer making up the second film are formed using the PVD method as described above. In the case of forming the third layer making up the first film and the second layer making up the second film by the PVD method, as conditions, for example, pressure is set to 0.01 to 50 Pa, power is set to 500 to 2000 W, the flow rate of Ar is set to 5 to 50 sccm, and the flow rate of $O_2$ is set to 5 to 50 sccm.

Since the third layer making up the first film and the second layer making up the second film are formed by the PVD method, formation speed is faster compared to the ALD method or the MOCVD method, such that it is possible to form a film that is thick to some degree within a short time.

The film thickness of the second layer making up the first film, the film thickness of the first layer making up the second film are not particularly limited, but it is necessary that the second layer making up the first film and the first layer making up the second film have a thickness of some degree or more so as not to cause damage to the semiconductor substrate when forming the third layer making up the first film, and the second layer making up the second film by the PVD method. Preferably, the film thickness of the first film is set to 1 nm or more.

In addition, since the second layer making up the first film and the first layer making up the second film are formed by the ALD method or the MOCVD method, it takes time to form a thick layer. Therefore, it is preferable that the thickness of the second layer making up the first film and the first layer making up the second film be substantially 5 nm or less.

Since the solid-state imaging device according to an embodiment of the present disclosure includes the first film in which above the effective region, the second layer is formed on the first layer and the third layer is formed on the second layer, a sufficient negative bias effect may be obtained in accordance with the three layers. In addition, since the solid-state imaging device includes the second film in which above the OB region, the second layer is formed on the first layer, a sufficient negative bias effect may be obtained in accordance with the two layers.

Particularly, since the film structure between the first film in the effective region and the second film in the OB region are made to be different, a difference between a dark current in the effective region and a dark current in the OB region is made to be small, and thereby a so-called OB difference in level may be improved. In addition, due to a film thickness dependency of the amount of dark current, the film having a negative fixed charge, it is possible to adjust the OB difference in level by adjusting the film thickness in accordance with the amount of dark current of each solid-state imaging device.

In addition, since it is possible to separately change the film thickness of the first film in the effective region and the film thickness of the second film in the OB region, in the case of sensing light from the first film side, in regard to a light sensing pixel section, it is possible to select an optimal film thickness of the film having a negative fixed charge as a reflection prevention film.

In addition, in the OB region, it is not necessary to consider incidence of light, such that it is possible to adjust the film thickness of the second film by only ameliorating the dark current, apart from the effect of the reflection prevention film.

In addition, since the second layer making up the first film and the first layer making up the second film are formed using the ALD method or the MOCVD method, damage may not be caused to the semiconductor substrate when forming the second layer making up the first film and the first layer making up the second film.

As described above, according to the embodiment of the present disclosure, it is possible to separately adjust the film thickness of the first film and the film thickness of the second film. Therefore, it is possible for the film thickness of the first film to be an optimal film thickness exhibiting a function of the reflection prevention film.

In addition, since light is not incident to the optical black region, it is not necessary for the second film to have the function of the reflection prevention film, such that it is possible for the film thickness of the second film to be an optimal film thickness to ameliorate the dark current.

Hereinafter, the solid-state imaging device according to an embodiment of the present disclosure will be described with reference to the attached drawings. In respective drawings, like reference numerals will be given to like parts having substantially the same functions. In addition, the description will be made in the following order.

1. Configuration of Solid-State Imaging Device
2. Method of Manufacturing Solid-State Imaging Device
3. Configuration of Imaging Apparatus, or the Like
4. Other Configuration and Method of Manufacturing Solid-State Imaging Device 1. Configuration of Solid-State Imaging Device First, a configuration of the solid-state imaging device 1 according to an embodiment of the present disclosure will be described with reference to FIG. 1. FIG. 1 shows a diagram illustrating a cross-sectional structure of the solid-state imaging device according to this embodiment. In addition, in this embodiment, an example in which the present disclosure is applied to a so-called rear surface irradiation type CMOS solid-state imaging device (CMOS image sensor) will be described.

In the solid-state imaging device 1, a charge storage region 4, which serves as a photodiode as a light sensing portion that performs a photoelectric conversion of incident light, is formed of an N-type impurity region at an effective region 21 and an OB region 22 in a semiconductor substrate 2. On a surface of the charge storage region 4, a positive charge storage region 5a or 5b is formed, and an HAD (Hole-Accumulation Diode Sensor) is configured by the charge storage region 4 and the positive charge storage region 5a or 5b. In addition, each of the charge storage region 4 and the positive charge storage region 5a or 5b is isolated by an isolation region 3.

In a surface side of the semiconductor substrate 2, a gate electrode 11 of a MOS transistor Tr is formed under the charge storage region 4 of the semiconductor substrate 2, and an interconnection layer 12 of a metallic interconnection is formed further under the charge storage region 4.

The gate electrode 11 and the interconnection layer 12 of each layer are insulated by an interlayer insulation layer 13. In addition, the insulation layer 13 is supported by a supporting substrate that is provided at a lower side (not shown), or the like.

The photodiode having the charge storage region 4 makes up each pixel. Each pixel includes one or more of transistors including the MOS transistor (in this case, a transmission transistor that reads out and transmits the charge stored in the charge storage region 4) Tr.

Each charge storage region 4 of each pixel is isolated by the P-type isolation region 3. In addition, although not shown, it is preferable that a p+ semiconductor region be formed at a gate electrode 11 side interface of the MOS transistor Tr of the charge storage region 4 to suppress occurrence of the dark current at the interface with the insulation layer 13.

In a rear surface side of the semiconductor substrate 2, a first film (hereinafter, referred to as a "first film") 31 that has a negative fixed charge is formed on an upper layer of the effective region 21. The first film 31 has a configuration in which a first layer 31a formed on the semiconductor substrate 2, a second layer 31b formed on the first layer 31a, and a third layer 31c formed on the second layer 31b are laminated.

For example, the first layer 31a has any one of the hafnium oxide film, the aluminum oxide film, the zirconium oxide film, the tantalum oxide film, and the titanium oxide film, and is formed by the ALD method or the MOCVD method.

In addition, the second layer 31b has at any one of the hafnium oxide film, the aluminum oxide film, the zirconium oxide film, the tantalum oxide film, and the titanium oxide film, and is formed by the ALD method or the MOCVD method.

Both of the first layer 31a and the second layer 31b are formed by the ALD method or the MOCVD method, the first layer 31a and the second layer 31b are also collectively referred to as ALD layers.

In addition, the third layer 31c has any one of the hafnium oxide film, the aluminum oxide film, the zirconium oxide film, the tantalum oxide film, and the titanium oxide film, and is formed by the PVD method. Therefore, the third layer 31c is also referred to as a PVD layer.

In this manner, the first film 31 in which the first layer 31a, the second layer 31b, and the third layer 31c, which have a negative fixed charge, are laminated is formed on an upper layer of the effective region 21. An electric field is added to a surface of the charge storage region 4 due to the negative fixed charge in the first film 31, and therefore the positive charge storage region 5a is formed on the surface of the charge storage region 4. Therefore, even when an ion is not implanted in the surface of the charge storage region 4, it is possible to form the positive charge storage region 5a.

An insulation film 6a formed of, for example, a silicon oxide ($SiO_2$) film is formed on the first film 31, and a planarization film 8a is formed on the insulation film 6a. In addition, for each pixel, color filters 9 of corresponding colors (red R, green G, and blue B) are formed on the planarization film 8a, and an on-chip lens 10 for condensing is provided on each of the color filters 9.

A second film (hereinafter, referred to as a "second film") 32 having a negative fixed charge is formed on an upper layer of the OB region 22. The second film 32 has a configuration in which a first layer 32b formed on the semiconductor substrate 2 and a second layer 32c formed on the first layer 32b are laminated.

The first layer 32b includes, for example, any one of the hafnium oxide film, the aluminum oxide film, the zirconium oxide film, the tantalum oxide film, and the titanium oxide film, and is formed by the ALD method or the MOCVD method. Therefore, the first layer 32b is also referred to as an ALD layer.

The second layer 32c includes, for example, any one of the hafnium oxide film, the aluminum oxide film, the zirconium oxide film, the tantalum oxide film, and the titanium oxide film, and is formed by the PVD method. Therefore, the second layer 32c is also referred to as a PVD layer.

In this manner, the second film 32 in which the first layer 32b and the second layer 32c, which have a negative fixed charge, are laminated is formed on an upper layer of the OB region 22, such that an electric field is added to a surface of the charge storage region 4 due to the negative fixed charge in the second film 32, and the positive charge storage region 5 is formed on the surface of the charge storage region 4. Therefore, even when an ion is not implanted in the surface of the charge storage region 4, it is possible to form the positive charge storage region 5b.

An insulation film 6b formed of, for example, a silicon oxide ($SiO_2$) film is formed on the second film 32, and a light shielding film 7 is formed on the insulation film 6b to cover the OB region 22. Due to this light shielding film 7, a region (optical black region (not shown)) in which light is not incident to a photodiode is formed, and the black level in an image may be determined by an output of the photodiode.

As described above, the first film 31 has a lamination structure of three layers, and the second film 32 has a lamination structure of two layers. In this manner, in the solid-state imaging device 1, the number of layers of the first film 31 is different from the number of layers of the second film 32. In this embodiment, the number of layers of the first film 31 is larger than the number of layers of the second film 32, and the film thickness of the first film 31 is larger than that of the second film 32. However, the difference (difference in level) between the film thickness of the first film 31 and the film thickness of the second film 32 is substantially several nm. This degree of difference in level may be absorbed by forming insulation films 6a and 6b or planarization films 8a and 8b on the first film 31 and the second film 32 as described below, such that the color filters 9 or the like of the solid-state imaging device 1 may be formed on a flat film.

The planarization film 8b is formed to cover the insulation film 6b and the light shielding film 7.

In the solid-state imaging device 1 according to this embodiment of the present disclosure, when light is incident from an upper side of FIG. 1, a photoelectric conversion to convert the light into a signal charge occurs in the charge storage region 4 of the photodiode, such that the incident light may be sensed and detected. In addition, the solid-state imaging device 1 has a so-called rear surface irradiation type structure in which when seen from the semiconductor substrate 2 in which the photodiode is formed, light is made to be incident from an upper layer of a side (rear surface side) opposite to a side (front surface side) of the interconnection layer 12 formed in a lower layer.

Figure 7:
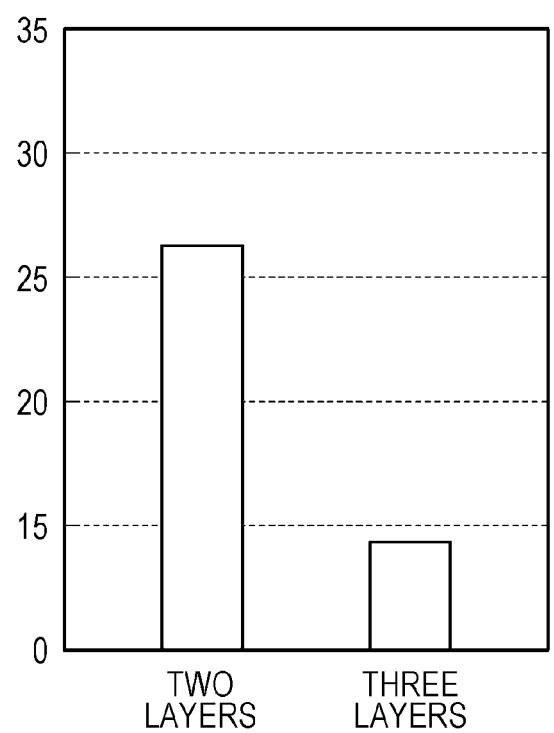
FIG. 7 is a diagram illustrating a relationship between a thickness of a film having a negative fixed charge and an amount of dark current.

Particularly, in the solid-state imaging device 1, since the first film 31 is formed on the effective region 21, and the second film 32 is formed on the OB region 22, a reduction in the dark current in the effective region 21 and a reduction in the dark current in the OB region 22 may be performed individually. Therefore, as shown in FIG. 7, it is possible to reduce the difference in the amount of dark current between the effective region 21 and the OB region 22, such that it is possible to suppress occurrence of the so-called OB difference in level.

In the solid-state imaging device 1 according to this embodiment, particularly, the first film 31 in the effective region 21 has a lamination structure of three layers including the first layer 31a, the second layer 31b formed on the first layer 31a, and the third layer 31c formed on the second layer 31b. In addition, the second film 32 in the OB region 22 has a lamination structure of two layers including the first layer 32b and the second layer 32c formed on the first layer 32b.

In the first film 31, the first layer 31a and the second layer 31b are formed by the ALD method or the MOCVD method, and the third layer 31c is formed by the PVD method. In addition, in the second film 32, the first layer 32b is formed by the ALD method or the MOCVD method, and the second layer 32c is formed by the PVD method.

As the material of the first layer 31a, the second layer 31b, and the third layer 31c, which make up the first film 31, for example, any one of the hafnium oxide, the aluminum oxide, the zirconium oxide, the tantalum oxide, and the titanium oxide may be used. In addition, the above-described nitride or oxynitride, oxides of rare-earth elements, or the like may be used.

In addition, as a material of the first layer 32b and the second layer 32c that make up the second film 32, for example, any one of the hafnium oxide, the aluminum oxide, the zirconium oxide, the tantalum oxide, and the titanium oxide may be used. In addition, the above-described nitride or oxynitride, oxides of rare-earth elements, or the like may be used.

When the first film 31 and the second film 32 are provided on an upper layer of the semiconductor substrate 2, it is possible to store a positive charge (hole) in the vicinity of an interface. In addition, particularly, when an oxide film such as the hafnium oxide film, the tantalum oxide film, and the titanium oxide film, which has a relatively high refraction index, is formed as the first film 31, it is also possible to obtain the reflection prevention effect.

Figure 2A:
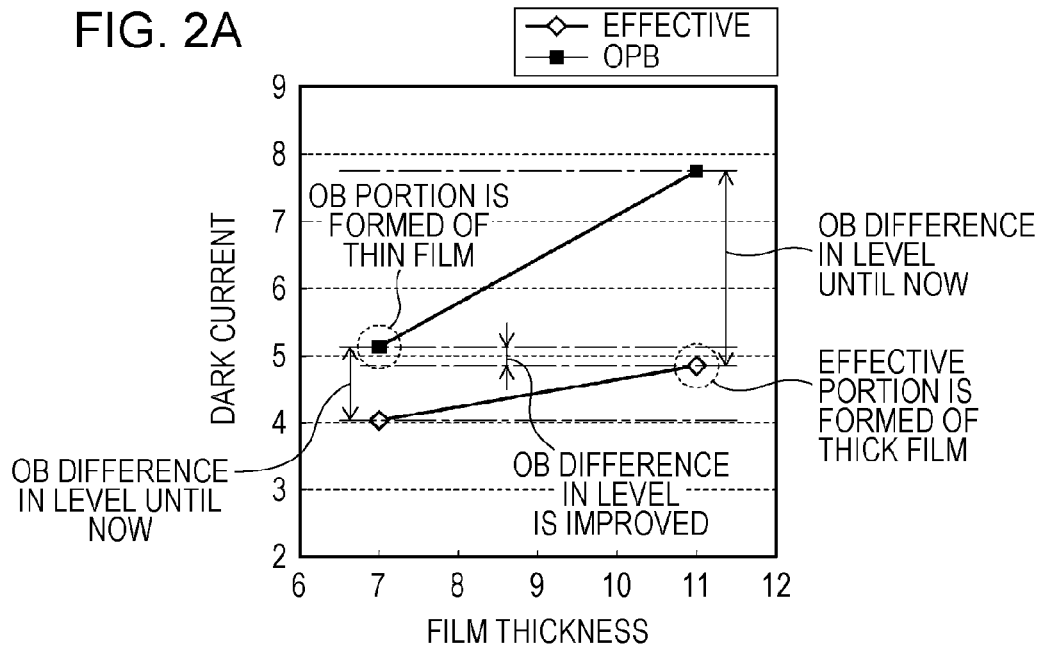
FIGS. 2A to 2C are diagrams illustrating a relationship between a thickness of a film having a negative fixed charge and an amount of dark current.
Figure 2B:
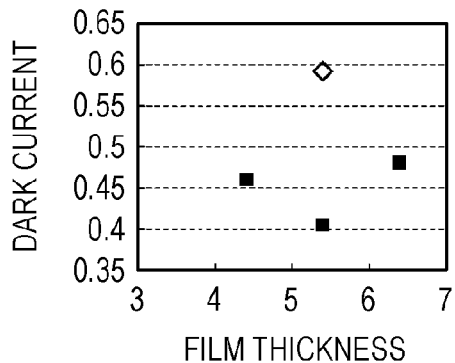
Figure 2C:
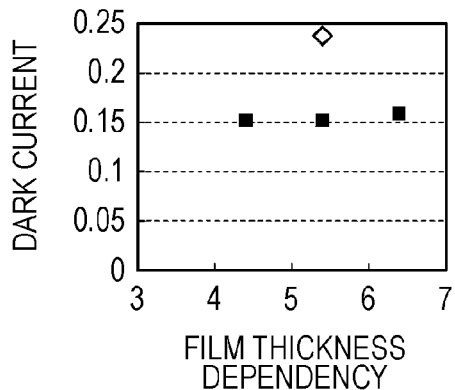

FIGS. 2A to 2C illustrate a relationship between the film thickness of the films 31 and 32 that have a negative fixed charge and the amount of dark current. FIG. 2A shows a diagram illustrating a relationship between the thickness of the ALD layer and the amount of dark current, and FIGS. 2B and 2C show diagrams illustrating a relationship between the thickness of the PVD layer and the amount of dark current. As shown in FIGS. 2B and 2C, the amount of dark current does not depend on the film thickness of the PVD layer, and as shown in FIG. 2A, the amount of dark current depends on the thickness of the ALD layer.

As shown in FIG. 2A, the amount of dark current in the effective region is larger than that in the OB region. In addition, when the thickness of the ALD layer together with the first film 31 and the second film 32 is made to be small, the amount of dark current decreases. In the solid-state imaging device until now, the films are formed on the semiconductor substrate 2 in such a manner that the thickness of the ALD layer in the effective region and the OB region are equal to each other. Therefore, a predetermined difference (OB difference in level) or more in the amount of dark current between the effective region and the OB region occurs, and the more the film thickness increases, the further the difference increases.

On the other hand, in the solid-state imaging device 1 according to this embodiment, the thickness of the ALD layer of the effective region, in which the amount of dark current is large, is set to be larger than that of the ALD layer in the OB region. Therefore, the difference between the amount of dark current in the effective region and the amount of dark current in the OB region decreases.

2. Method of Manufacturing Solid-State Imaging Device

Next, a method of manufacturing the solid-state imaging device 1 according to this embodiment will be described. FIGS. 3A to 3E show diagrams illustrating the method of manufacturing the solid-state imaging device 1. In addition, the following description will be started from a state in which the charge storage region 4 is formed in the semiconductor substrate 2 of the effective region 21, and the gate electrode 11 and the interconnection layer 12 of the MOS transistor Tr are formed.

Figure 3A:
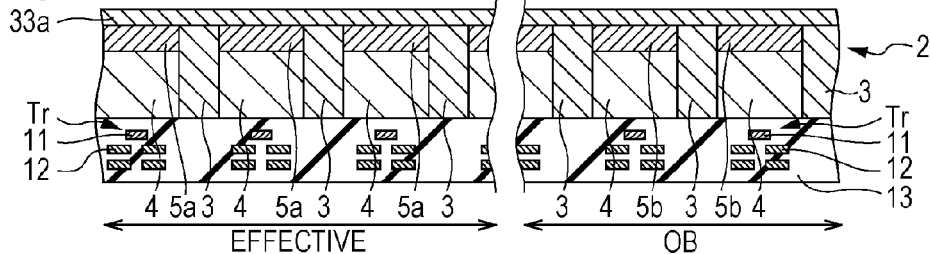
FIGS. 3A to 3E are diagrams illustrating a method of manufacturing the solid-state imaging device according to the embodiment of the present disclosure.

First, as shown in FIG. 3A, a hafnium oxide film as a film 33a having a negative fixed charge is formed on the effective region 21 and the OB region 22 of the semiconductor substrate 2 by the ALD method or the MOCVD method. In addition, as a material of the film 33a having a negative fixed charge, in addition to the above-described hafnium oxide, for example, any one of the aluminum oxide, the zirconium oxide, the tantalum oxide, and the titanium oxide may be used.

Formation conditions in the case of the ALD method are as follows. For example, a temperature of a formation substrate is set to 200 to 500° C., a flow rate of a precursor is set to 10 to 500 sccm, an irradiation time is set to 1 to 15 seconds, and a flow rate of $O_3$ is set to 10 to 500 sccm. In addition, the film thickness of the film 33a having a negative fixed charge is preferably 1 nm or more.

Figure 3B:
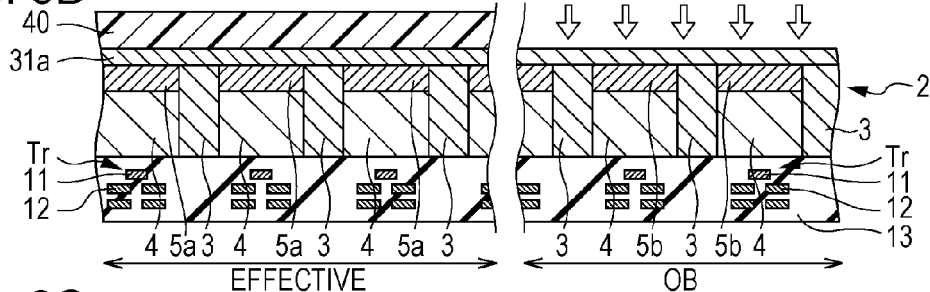
Figure 3C:
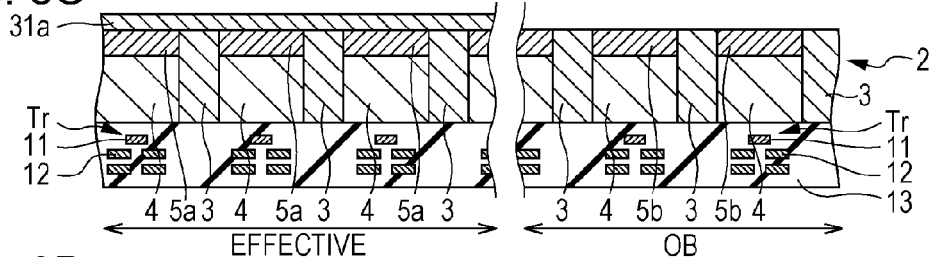

Next, as shown in FIG. 3B, a resist 40 is formed on the film 33a having a negative fixed charge in the effective region 21, and then the resist 40 and an exposed portion of the film 33a having a negative fixed charge are removed by wet etching. Due to this, as shown in FIG. 3C, the first layer 31a making up the first film 31 is formed on the effective region 21 of the semiconductor substrate 2.

Figure 3D:
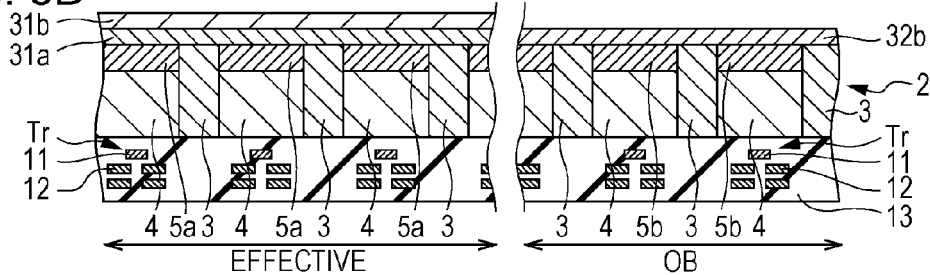

Next, as shown in FIG. 3D, a hafnium oxide film as a film 34 having a negative fixed charge is formed on the first layer 31a and the OB region 22 by the ALD method or the MOCVD method. Therefore, the second layer 31b is formed on the first layer 31a, and the first layer 32b of the second film 32 is formed on the OB region 22. In addition, as a material of the film 34 having a negative fixed charge, in addition to the above-described hafnium oxide, for example, any one of the aluminum oxide, the zirconium oxide, the tantalum oxide, and the titanium oxide may be used.

In addition, formation conditions in the case of the ALD method are as follows. For example, the temperature of a formation substrate is set to 200 to 500° C., the flow rate of a precursor is set to 10 to 500 sccm, the irradiation time is set to 1 to 15 seconds, and the flow rate of $O_3$ is set to 10 to 500 sccm.

Figure 3E:
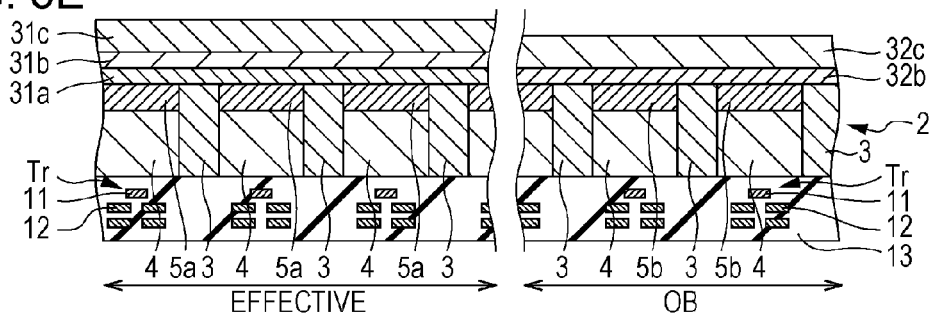

Next, as shown in FIG. 3E, a tantalum oxide film as a film 35 having a negative fixed charge is formed on the second layer 31b of the first film 31 and the first layer 32b of the second film 32 by the PVD method. Therefore, the third layer 31c is formed on the second layer 31b, and the second layer 32c is formed on the first layer 32b. In addition, as a material of the film 35 having a negative fixed charge, in addition to the above-described tantalum oxide, for example, any one of the hafnium oxide, the aluminum oxide, the zirconium oxide, and the titanium oxide may be used.

In addition, formation conditions in the case of the PVD method are as follows. For example, pressure is set to 0.01 to 50 Pa, DC power is set to 500 to 2000 W, the flow rate of Ar is set to 5 to 50 sccm, and the flow rate of $O_2$ is set to 5 to 50 sccm.

Through the processes shown in FIGS. 3A to 3E, the first film 31 and the second film 32 that are characteristic configurations of the solid-state imaging device 1 are formed. In this manner, the second layer 31b of the first film 31 and the first layer 32b of the second film 32 are integrally formed by forming the film 34. In addition, the third layer 31c of the first film 31 and the second layer 32c of the second film 32 are integrally formed by forming the film 35.

Next, although not shown, the insulation films 6a and 6b formed of silicon oxide are formed on the first film 31 and the second film 32 by the PVD method. Specifically, the insulation film 6a is formed on the third layer 31c of the first film 31, and the insulation film 6b is formed on the second layer 32c of the second film 32.

In addition, when the insulation film 6b is formed in the OB region 22, it is possible to prevent a surface of the second layer 32c of the second film 32 from being directly exposed at the time of etching the thick light shielding film 7. In addition, it is possible to suppress a reaction between the second layer 32c of the second film 32 and the light shielding film 7, which is caused by a direct contact between the second layer 32c of the second film 32 and the light shielding film 7.

Next, although not shown, the light shielding film 7 is formed on the insulation film 6b. Specifically, a metallic film serving as the light shielding film 7 is formed on the insulation films 6a and 6b by the PVD method. Subsequently, a resist is formed on the metallic film on the insulation 6a, and then the resist and an exposed portion of the metallic film is removed by etching. In this manner, the light shielding film 7 is formed on the insulation film 6b.

Next, although not shown, a silicon oxide film as the planarization films 8a and 8b is formed to cover the insulation film 6a and the light shielding film 7 by an application method. When the planarization films 8a and 8b are formed to have a sufficient thickness, the difference in level due to the light shielding film 7 may disappear, such that the surface may be planarized.

Finally, although not shown, the color filters 9 and the on-chip lenses 10 are formed sequentially on the planarization film 8a in the effective region 21, that is, at an upper side of the photodiode of each pixel. In addition, a light transmitting insulation film (not shown) may be formed between the color filters 9 and the on-chip lenses 10 for the prevention of processing damage to the color filters 9 at the time of processing lenses.

Through the above-described processes, the solid-state imaging device 1 shown in FIG. 1 is manufactured. In this manner, in the method of manufacturing the solid-state imaging device according to this embodiment, since the first film 31 is formed on the effective region 21, the positive charge storage region 5a is formed on the surface of the charge storage region 4 in the effective region 21. Due to the positive charge storage region 5a, the occurrence of dark current on the surface of the charge storage region 4 in the effective region 21 is suppressed.

In addition, since the second film 32 is formed on the OB region 22, the positive charge storage region 5b is formed on the surface of the charge storage region 4 in the OB region 22. Due to the positive charge storage region 5b, the occurrence of the dark current on the surface of the charge storage region 4 in the OB region 22 is suppressed.

Furthermore, in the solid-state imaging device 1, since the first film 31 and the second film 32 are separately formed, and have different film configurations and film thicknesses, it is possible to make the difference in the amount of dark current between the effective region 21 and the OB region 22 small. Therefore, a so-called OB difference in level may be improved.

In addition, since the first film 31 and the second film 32 are separately formed, the first film in the effective region may have a film structure and a film thickness that is optimal for a reflection prevention film. In addition, since it is not necessary to consider the incidence of light in the OB region, the second film 32 may have a film configuration that is specialized for amelioration of dark current.

The first film 31 may obtain a sufficient negative bias effect in accordance with the three layers of the first layer 31a, the second layer 31b, and the third layer 31c. In addition, the second film 32 may obtain a sufficient negative bias effect in accordance with the two layers of the first layer 32b and the second layer 32c. Due to the negative fixed charge, the positive charge storage region 5a is formed in the vicinity of an interface in order for a positive charge (hole) to be stored, and therefore the occurrence of the dark current caused by an interface state may be suppressed.

Therefore, according to this embodiment, since the occurrence of the dark current that is caused by the interface state may be suppressed due to the sufficient negative bias effect, it is possible to realize the solid-state imaging device 1 having high reliability, which stably operates without causing dark current to occur.

In the above-described embodiment, an example in which the present disclosure is applied to the CMOS solid-state imaging device is described, but the present disclosure may be applicable to solid-state imaging devices having other configurations. For example, the present disclosure is applicable to a CCD solid-state imaging device, and it is possible to suppress the occurrence of dark current caused by the interface state by forming a silicon oxide film formed using plasma and a film having a negative fixed charge on a light sensing portion.

In addition, in the above-described embodiment, the present disclosure is applied to the solid-state imaging device having a rear surface irradiation type structure. However, the present disclosure is applicable to a solid-state imaging device having a so-called front surface irradiation type structure in which an interconnection layer and a transmission electrode are formed at light incidence side of the semiconductor substrate on which the photodiode is formed.

3. Configuration of Imaging Apparatus, or the Like

Figure 4:
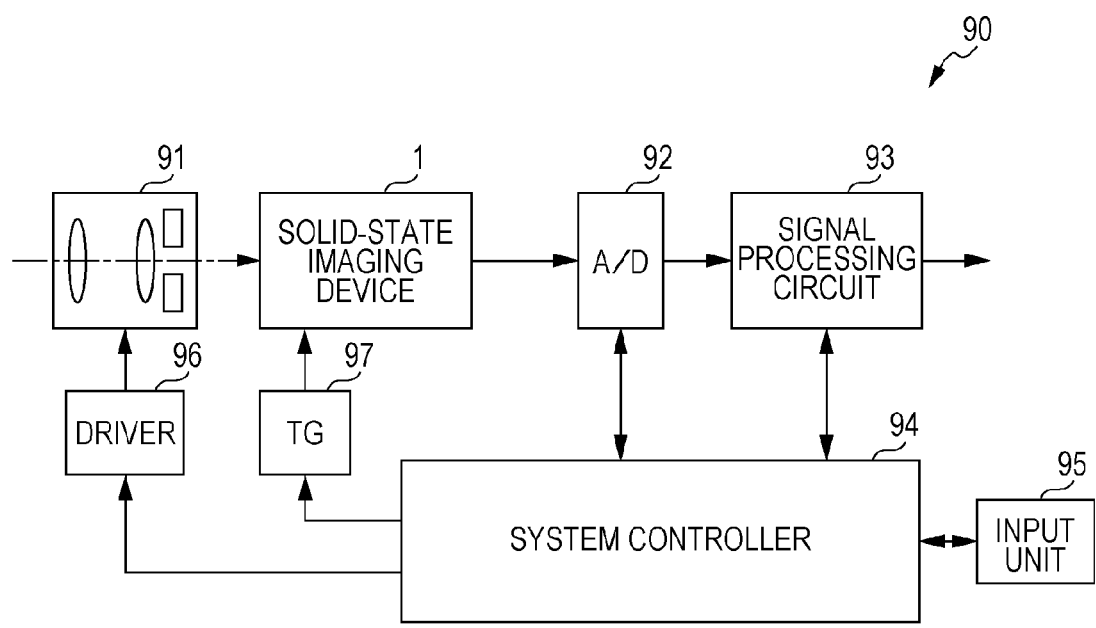
FIG. 4 is a diagram illustrating a configuration of an imaging apparatus including the solid-state imaging device according to the embodiment of the present disclosure.

Hereinafter, an imaging apparatus including the solid-state imaging device 1 configured as described will be described. FIG. 4 shows a diagram illustrating a configuration of the imaging apparatus including the solid-state imaging device 1. In addition, as the imaging apparatus 90, for example, a video camera, a digital still camera, a camera of a cellular phone, or the like may be exemplified.

As shown in FIG. 4, the imaging apparatus 90 includes an optical block 91, the solid-state imaging device 1, an A/D (analog/digital) converting circuit 92, a signal processing circuit 93, a system controller 94 as a control unit, and an input unit 95. In addition, a driver 96 that allows a mechanism in the optical block 91 to operate, a timing generator (hereinafter, referred to as "TG") 97 as a driving unit generating a driving pulse that allows the solid-state imaging device 1 to operate, and the like are provided in the imaging apparatus 90.

The optical block 91 includes a lens that condenses light from a subject to the solid-state imaging device 1, a driving mechanism that moves the lens so as to perform a focus adjustment and zooming, a mechanical shutter, an aperture stop, or the like. The driver 96 controls an operation of the mechanism in the optical block 91 in response to a control signal transmitted from the system controller 94.

The solid-state imaging device 1 operates on the basis of the driving pulse generated by the TG 97 and converts the incident light from the subject to an electrical signal. The TG 97 generates the driving pulse under the control of the system controller 94.

The A/D converting circuit 92 performs A/D conversion of an image signal output from the solid-state imaging device 1 and outputs a digital image signal.

The signal processing circuit 93 performs various camera signal processing such as an AF (Auto Focus), an AE (Auto Exposure), an interpolation processing of a defective pixel, or the like with respect to the digital image signal transmitted from the A/D converting circuit 92.

The system controller 94 includes, for example, a CPU (Central Processing Unit), a ROM (Read Only Memory), a RAM (Random Access Memory), or the like. The CPU is a unit to execute a program stored in the ROM or the like. The CPU generally controls each unit of the imaging apparatus, and performs various calculations for the control. The input unit 95 includes an operation key, a dial, a lever, or the like, which receive an operation input of a user, and outputs a control signal corresponding to the operation input to the system controller 94.

In the imaging apparatus 90, the image signal, which corresponds to a signal charge that is sensed by the solid-state imaging device 1 and is subjected to a photoelectric conversion, is sequentially supplied to the A/D converting circuit 92 and is converted to a digital signal. This converted digital signal is subjected to an image correction processing by the signal processing circuit 93, and is converted to a luminance signal and a color difference signal to be output. The image data output from the signal processing circuit 93 is supplied to a graphic interface circuit (not shown) and is finally converted to an image signal for display, and therefore a camera through image is displayed on a monitor (not shown).

4. Other Configuration and Method of Manufacturing Solid-State Imaging Device Hereinafter, a modification of the solid-state imaging device will be described.

First Modification

Figure 5:
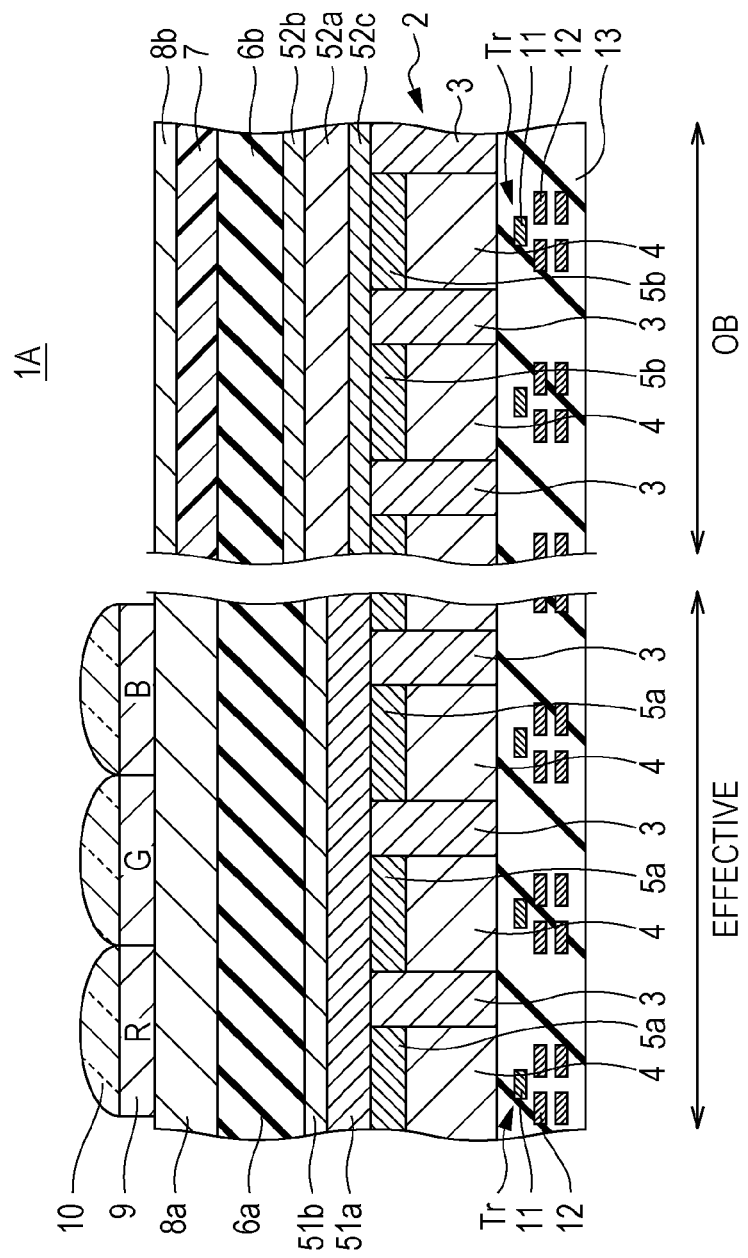
FIG. 5 is a diagram illustrating a cross-sectional structure of a solid-state imaging device according to a first modification.

First, a solid-state imaging device 1A according to a first modification will be described with reference FIG. 5. FIG. 5 is a diagram illustrating a cross-sectional structure of the solid-state imaging device 1A according to the first modification. In the solid-state imaging device 1A according to this modification, a film configuration of the first film and the second film that have a negative fixed charge is made different with respect to the above-described solid-state imaging device 1. In addition, in the following description, like reference numerals will be given to like parts having substantially the same functions as the solid-state imaging device 1 shown in FIG. 1.

As shown in FIG. 5, in the solid-state imaging device 1A, a first film 51 is formed on the effective region 21 of the semiconductor substrate 2, and a second film 52 is formed on the OB region 22.

The first film 51 has a configuration in that a first layer 51a formed on the semiconductor substrate 2 and a second layer 51b formed on the first layer 51a are laminated.

The first layer 51a is formed of, for example, any one of a hafnium oxide film, an aluminum oxide film, a zirconium oxide film, a tantalum oxide film, and titanium oxide film, and is formed by the PVD method.

In addition, the second layer 51b is formed of, for example, any one of the hafnium oxide film, the aluminum oxide film, the zirconium oxide film, the tantalum oxide film, and the titanium oxide film, and is formed by the ALD method or the MOCVD method.

In addition, the second film 52 has a configuration in that a first layer 52c formed on the semiconductor substrate 2, a second layer 52a formed on the first layer 52c, and a third layer 52b formed on the second layer 52a are laminated.

The first layer 52c is formed of, for example, any one of the hafnium oxide film, the aluminum oxide film, the zirconium oxide film, the tantalum oxide film, and the titanium oxide film, and is formed by the ALD method or the MOCVD method.

In addition, the second layer 52a is formed of, for example, any one of the hafnium oxide film, the aluminum oxide film, the zirconium oxide film, the tantalum oxide film, and the titanium oxide film, and is formed by the PVD method.

In addition, the third layer 52b is formed of, for example, any one of the hafnium oxide film, the aluminum oxide film, the zirconium oxide film, the tantalum oxide film, and the titanium oxide film, and is formed by the ALD method or the MOCVD method.

As described above, the first film 51 has a lamination structure of two layers, and the second film 52 has a lamination structure of three layers. In this manner, in the solid-state imaging device 1A, the number of layers of the first film 51 is different from the number of layers of the second film 52. In this embodiment, the number of layers of the first film 51 is smaller than the number of layers of the second film 52.

Next, a method of manufacturing the solid-state imaging device 1A according to this embodiment will be described. FIGS. 6A to 6E show diagrams illustrating the method of manufacturing the solid-state imaging device 1A. Here, processes of forming the first film 51 and the second film 52, which are characteristic configurations of the method of manufacturing the solid-state imaging device 1A according to this modification, will be described, and like reference numerals will be given to the other configurations and description thereof will be omitted.

Figure 6A:
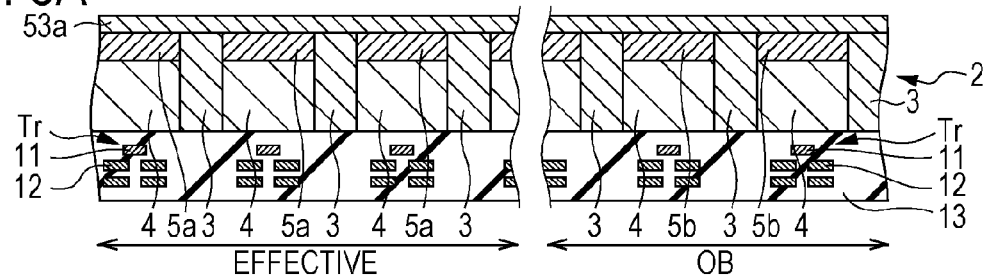
FIGS. 6A to 6E are diagrams illustrating a method of manufacturing the solid-state imaging device according to the first modification.

First, as shown in FIG. 6A, a film 53a having a negative fixed charge is formed on the effective region 21 and the OB region 22 of the semiconductor substrate 2 by the ALD method or the MOCVD method. As a material of the film 53a having a negative fixed charge, for example, any one of a hafnium oxide, an aluminum oxide, a zirconium oxide, a tantalum oxide, and a titanium oxide may be exemplified.

Figure 6B:
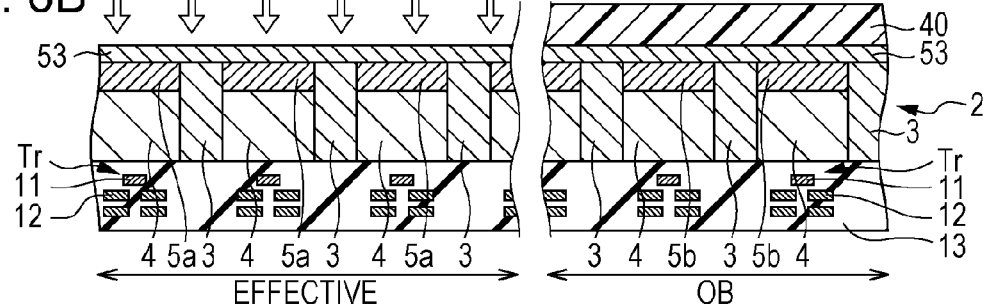
Figure 6C:
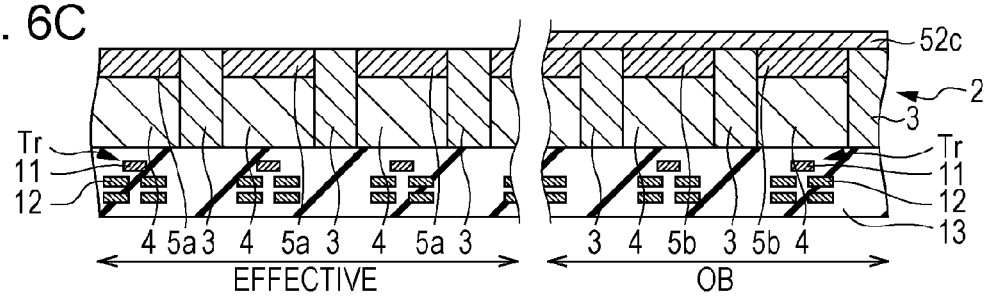

Next, as shown in FIG. 6B, a resist 40 is formed on the film 53a that has a negative fixed charge and is formed on the OB region 22, and then wet-etching is performed. In this manner, as shown in FIG. 6C, the film 53a that is formed on the effective region 21 and has a negative fixed charge is selectively removed, and thereby the first layer 52c of the second film 52 is formed on the OB region 22.

Figure 6D:
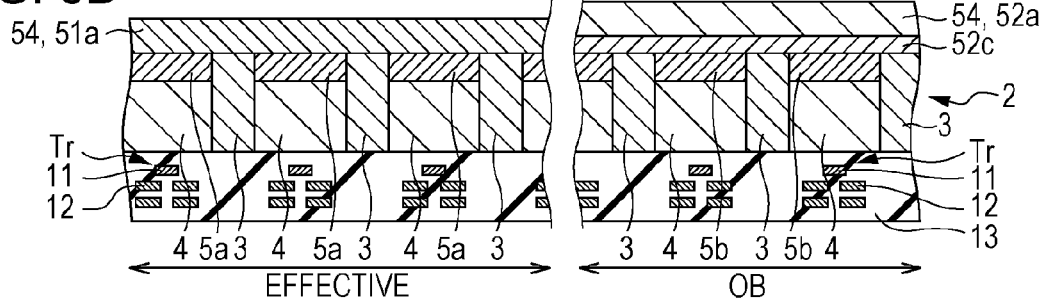

Next, as shown in FIG. 6D, a film 54 having a negative fixed charge is formed on the semiconductor substrate 2 in the effective region 21 and on the first layer 52c of the second film 52 by the PVD method. In this manner, the first layer 51a of the first film 51 is formed on the semiconductor substrate 2 in the effective region 21, and the second layer 52a is formed on the first layer 52c of the second film 52. As a material of the film 54 having a negative fixed charge, for example, any one of the hafnium oxide, the aluminum oxide, the zirconium oxide, the tantalum oxide, and the titanium oxide may be exemplified.

In addition, formation conditions in the case of the PVD method are as follows. For example, pressure is set to 0.01 to 50 Pa, DC power is set to 500 to 2000 W, the flow rate of Ar is set to 5 to 50 sccm, and the flow rate of $O_2$ is set to 5 to 50 sccm.

Figure 6E:
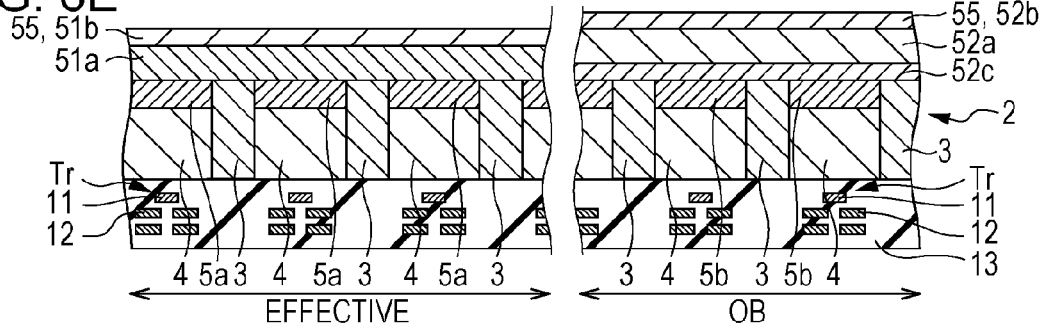

Next, as shown in FIG. 6E, a film 55 having a negative fixed charge is formed on the film 54 having a negative fixed charge by the ALD method or the MOCVD method. In this manner, the second layer 51b is formed on the first layer 51a of the first film 51, and the third layer 52b is formed on the second layer 52a of the second film 52. As a material of the film 55 having a negative fixed charge, for example, any one of a hafnium oxide, an aluminum oxide, a zirconium oxide, a tantalum oxide, and a titanium oxide may be exemplified.

In addition, formation conditions in the case of the ALD method are as follows. For example, the temperature of a formation substrate is set to 200 to 500° C., the flow rate of a precursor is set to 10 to 500 sccm, the irradiation time is set to 1 to 15 seconds, and the flow rate of $O_3$ is set to 10 to 500 sccm. The film thickness of the first film is preferably 1 nm or more. In addition, in the case of forming the first film by the ALD method, a silicon oxide film (the thickness thereof is substantially 1 nm) may be formed on a surface of the semiconductor substrate 2.

When the second layer 51b is formed on the first layer 51a, the first film 51 in which two layers 51a and 51b are laminated is configured. Due to this first film 51, the positive charge storage region 5a is formed on a surface of the charge storage region 4 in the effective region 21.

In addition, the second layer 52a is formed on the first layer 52c, and the third layer 52b is formed on the second layer 52a, such that the second film 52 in which the three layers 52c, 52a, and 52b are laminated is configured. Due to the second film 52, the positive charge storage region 5b is formed on a surface of the charge storage region 4 in the OB region 22.

The first layer 51a of the first film 51 and the second layer 52a of the second film 52 are integrally formed by forming the film 54. In addition, the second layer 51b of the first film 51 and the third layer 52b of the second film 52 are integrally formed by form the film 55.

Next, the insulation film 6, the light shielding film 7, the planarization film 8, the color filters 9, and the on-chip lenses 10 are formed by the same processes as those described above, and thereby the solid-state imaging device 1A shown in FIG. 5 may be manufactured.

FIG. 7 illustrate an amount of dark current with respect to the second film 52 in a case where the second film 52 includes a first layer 52c and a second layer 52b, and in a case where the second film 52 includes the first to third layers 52c to 52b like this modification. As shown in FIG. 7, it can be seen that the amount of dark current in the OB region is small in a case where the second film 52 includes three layers of the first to third layers 52c to 52b.

On the other hand, since in the effective region, the semiconductor substrate 2 and the first layer 51a formed by the PVD method come into contact with each other, the amount of dark current increases compared to a case where in the first film 51, the layer formed by the PVD method is laminated on the layer formed by the ALD method. This is because the layer formed by the PVD method is less dense compared to the layer formed by the ALD method or the like, such that a substance interrupting the negative fixed charge, such as hydrogen may easily invade the layer. In the effective region, since the layer formed by the PVD method is formed at a position close to an interface of the semiconductor substrate 2, the amount of dark current increases compared to a case where the layer formed by the ALD method is laminated on the semiconductor substrate 2.

Many dark currents occur in the OB region compared to the effective region. Therefore, in the solid-state imaging device 1A according to this modification, the amount of dark current that occurs in the effective region is made to be increased by forming the first film 51, and the amount of dark current that occurs in the OB region is made to be decreased by forming the second film 52. Therefore, it is possible to make the difference (OB difference in level) between the amount of dark current that occurs in the effective region and the amount of dark current that occurs in the OB region small.

In addition, since the second layer 51b of the first film 51 and the third layer 52b of the second film 52 are formed by the ALD method on the first layer 51a of the first film 51 and the second layer 52a of the second film 52 that are formed by the PVD method, respectively, it is possible to suppress the invasion of material such as hydrogen that interrupts the negative fixed charge. This is because as described above, the layer formed by the ALD method or the like is denser than the layer formed by the PVD method, such that it is difficult for the substance to invade the layer formed by the ALD method from the outside.

In addition, the first layer 51a and the second layer 51b of the first film 51 may be substituted for each other. In this case, the second layer 51b is formed on the semiconductor substrate 2 by the ALD method or the MOCVD method, and the first layer 51a is formed on the second layer 51b by the PVD method. The second layer 51b may be integrally the first layer 52c of the second film 52.

Second Modification

Figure 8:
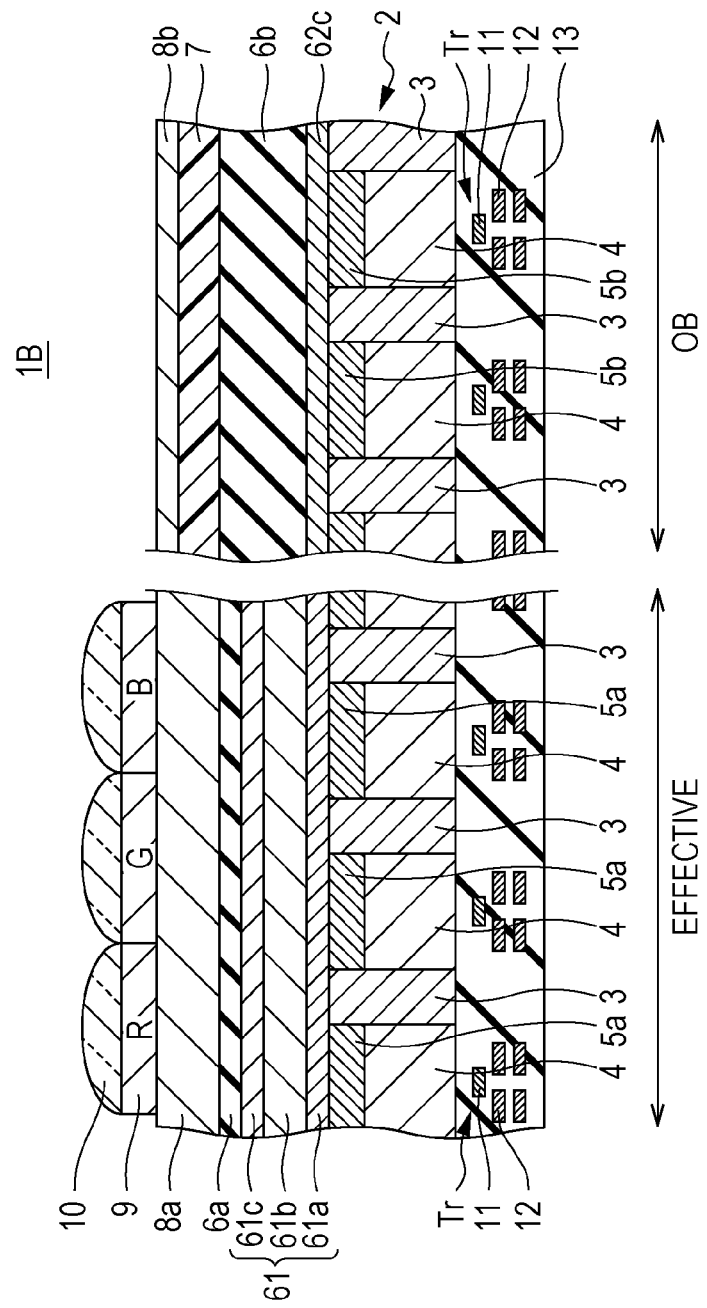
FIG. 8 is a diagram illustrating a cross-sectional structure of a solid-state imaging device according to a second modification.

Next, a solid-state imaging device 1B according to a second modification will be described. FIG. 8 shows a diagram illustrating a configuration a solid-state imaging device according to this modification of the present disclosure. In the solid-state imaging device 1B according to this modification, a film configuration of the film of the solid-state imaging device 1B, which has the negative fixed charge, is changed, and like reference numerals will be given to the other configurations and description thereof will be omitted.

As shown in FIG. 8, the solid-state imaging device 1B includes a first film 61 on the effective region 21 and a second film 62 on the OB region 22 of the semiconductor substrate 2.

The first film 61 has a configuration in which a first layer 61a formed on the semiconductor substrate 2, a second layer 61b formed on the first layer 61a, and a third layer 61c formed on the second layer 61b are laminated.

The first layer 61a is formed of, for example, any one of the hafnium oxide film, the aluminum oxide film, the zirconium oxide film, the tantalum oxide film, and the titanium oxide film, and is formed by the ALD method or the MOCVD method.

In addition, the second layer 61b is formed of, for example, any one of the hafnium oxide film, the aluminum oxide film, the zirconium oxide film, the tantalum oxide film, and the titanium oxide film, and is formed by the PVD method.

The third layer 61c is formed of, for example, any one of the hafnium oxide film, the aluminum oxide film, the zirconium oxide film, the tantalum oxide film, and the titanium oxide film, and is formed by the ALD method or the MOCVD method.

The second film 62 includes a first layer 62c formed on the semiconductor substrate 2. The first layer 62c is formed of, for example, any one of the hafnium oxide film, the aluminum oxide film, the zirconium oxide film, the tantalum oxide film, and the titanium oxide film, and is formed by the ALD method or the MOCVD method.

Next, a method of manufacturing the solid-state imaging device 1B will be described with reference to FIGS. 9A to 9E. Here, processes of forming the first film 61 and the second film 62, which are characteristic configurations of the solid-state imaging device 1B according to this modification, will be described, and description of the other processes will be omitted.

Figure 9A:
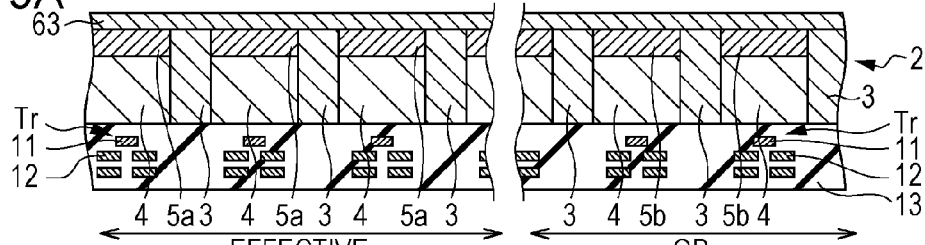
FIGS. 9A to 9E are diagrams illustrating a method of manufacturing the solid-state imaging device according to the second modification.

First, as shown in FIG. 9A, a film 63 having a negative fixed charge is formed on the effective region 21 and the OB region 22 of the semiconductor substrate 2 by the ALD method or the MOCVD method. As a material of the film 63 having a negative fixed charge, for example, any one of a hafnium oxide, an aluminum oxide, a zirconium oxide, a tantalum oxide, and a titanium oxide may be exemplified.

Formation conditions in the case of the ALD method are as follows. For example, the temperature of a formation substrate is set to 200 to 500° C., the flow rate of a precursor is set to 10 to 500 sccm, the irradiation time is set to 1 to 15 seconds, and the flow rate of $O_3$ is set to 10 to 500 sccm. The film thickness of the first film is preferably 1 nm or more. In addition, in the case of forming the first film by the ALD method, a silicon oxide film (the thickness thereof is substantially 1 nm) may be formed on a surface of the semiconductor substrate 2.

Figure 9B:
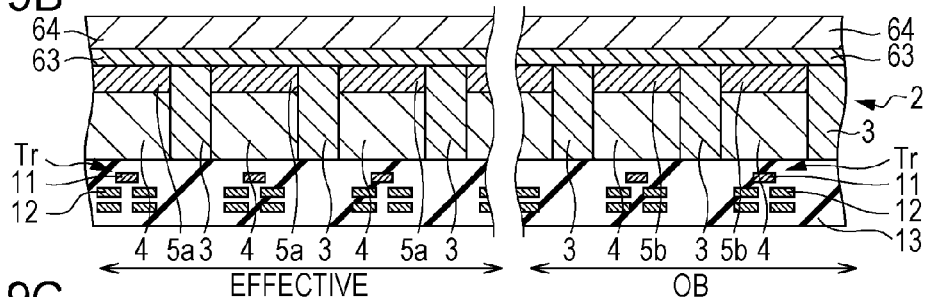

Next, as shown in FIG. 9B, a film 64 having a negative fixed charge is formed on the film 63 having a negative fixed charge by the PVD method. As a material of the film 64 having a negative fixed charge, for example, any one of a hafnium oxide, an aluminum oxide, a zirconium oxide, a tantalum oxide, and a titanium oxide may be exemplified.

In addition, formation conditions in the case of the PVD method are as follows. For example, pressure is set to 0.01 to 50 Pa, DC power is set to 500 to 2000 W, the flow rate of Ar is set to 5 to 50 sccm, and the flow rate of $O_2$ is set to 5 to 50 sccm.

Figure 9C:
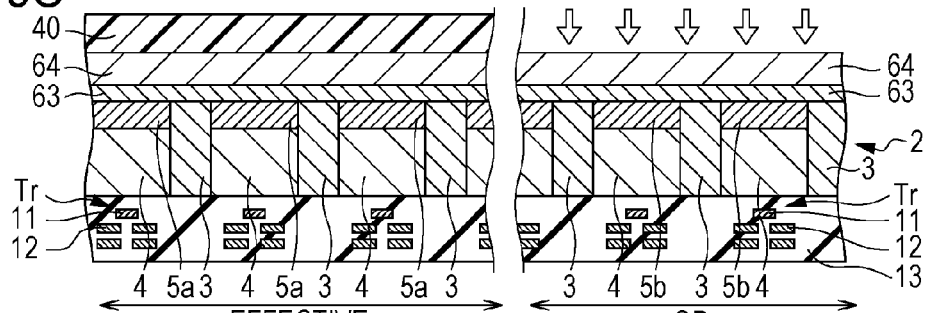
Figure 9D:
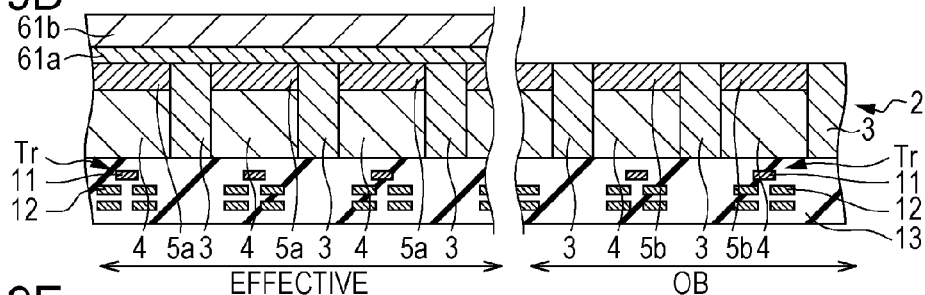

Next, as shown in FIG. 9C, a resist 40 is formed on the film 64 that has a negative fixed charge and is formed on the effective region 21 and then wet-etching is performed. Therefore, two layers of the films 63 and 64 that are formed above the OB region 22 and have a negative fixed charge are selectively removed, and thereby the first layer 61a and the second layer 61b of the first film 61 are formed above the effective region 21.

Figure 9E:
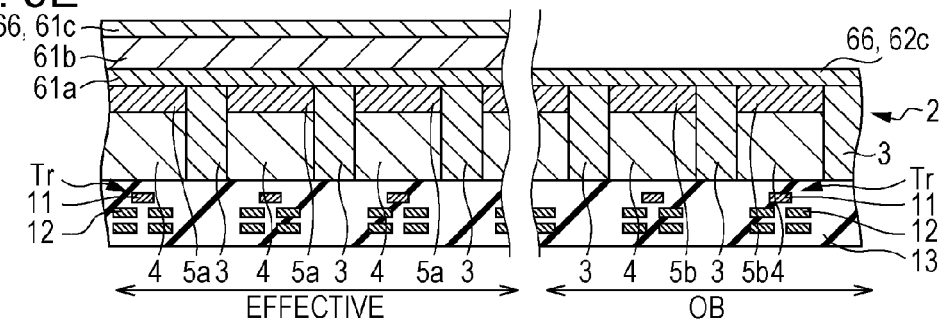

Next, as shown in FIG. 9E, a film 66 having a negative fixed charge is formed on the second layer 61b of the first film 61 and the semiconductor substrate 2 in the OB region 22 by the ALD method or the MOCVD method. In this manner, the third layer 61c of the first film 61 is formed, and the first layer 62c of the second film 62 is formed on the OB region 22 of the semiconductor substrate 2. As a material of the third layer 61c of the first film 61 and the first layer 62c of the second film 62, for example, any one of the hafnium oxide, the aluminum oxide, the zirconium oxide, the tantalum oxide, and the titanium oxide may be exemplified.

In addition, formation conditions in the case of the ALD method are as follows. For example, the temperature of a formation substrate is set to 200 to 500° C., the flow rate of a precursor is set to 10 to 500 sccm, the irradiation time is set to 1 to 15 seconds, and the flow rate of $O_3$ is set to 10 to 500 sccm.

The second layer 61b is formed on the first layer 61a, and the third layer 61c is formed on the second layer 61b, such that the first film 61 in which three layers 61a, 61b, and 61c are laminated is configured. Due to the first film 61, the positive charge storage region 5a is formed on a surface of the charge storage region 4 in the effective region 21.

In addition, due to the second film 62 including the first layer 62c, the positive charge storage region 5b is formed on a surface of the charge storage region 4 in the OB region 22.

The third layer 61c of the first film 61 and the first layer 62c of the second film 62 are integrally formed by forming the film 66.

Next, the insulation film 6, the light shielding film 7, the planarization film 8, the color filters 9, and the on-chip lenses 10 are formed by the same processes as those described above, and thereby the solid-state imaging device 1B shown in FIG. 8 is manufactured.

Figure 10:
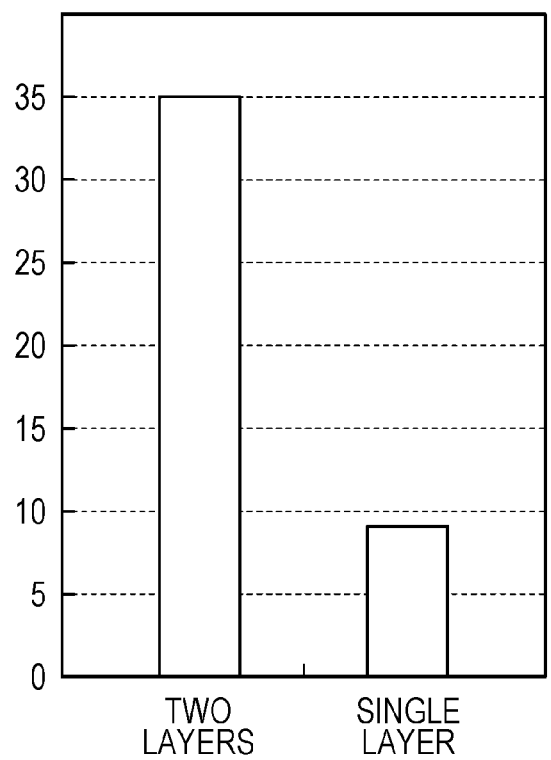
FIG. 10 is a diagram illustrating a relationship between a thickness of a film having a negative fixed charge and an amount of dark current.

FIG. 10 is a diagram illustrating an amount of dark current in a case where the second film 62 of the solid-state imaging device 1B is configured by a lamination structure of two layers including a layer formed by the ALD method and a layer formed by the PVD method, and in a case where the second film 62 includes one layer of the first layer 62c formed by the ALD method. As shown in FIG. 10, it can be seen that the amount of dark current in the OB region is small in a case where the second film 62 includes one layer (single layer) like this modification rather than two layers.

Since the layer formed by the PVD method is less dense compared to the layer formed by the ALD method, it may be liable to include hydrogen or the like that interrupts the negative fixed charge. Similarly to this modification, when the second film 62 is configured to include the layer formed by the ALD method without including the layer formed by the PVD method, it is difficult for a substance such as hydrogen interrupting the negative fixed charge to invade the layer formed by the ALD method. Therefore, it is possible to make the density of the negative fixed charge in the second film 62 of the solid-state imaging device 1B high, and therefore a negative bias effect increases, and the dark current may be ameliorated.

In this manner, it is possible to make the difference (OB difference in level) between the amount of dark current in the effective region and the amount of dark current in the OB region small by reducing the amount of dark current of the second film 62 that is formed in the OB region in which many dark currents occur.

According to the solid-state imaging device 1A having the above-described configuration, a temperature characteristic of the OB difference in level is improved. That is, even when the temperature of the semiconductor substrate increases, the deterioration of the OB difference in level is suppressed.

Finally, the description of the respective embodiments is an example of the present disclosure, and the present disclosure is not limited to the above-described embodiments. Even when it is deviated from the above-described respective embodiments, various modifications may be made by design or the like without departing from the scope of the present disclosure.

The present disclosure contains subject matter related to that disclosed in Japanese Priority Patent Application JP 2011-053237 filed in the Japan Patent Office on Mar. 10, 2011, the entire contents of which are hereby incorporated by reference.

What is claimed is:

1. A solid-state imaging device comprising:
a semiconductor substrate having an effective region in which a photodiode performing a photoelectric conversion is formed and, an optical black region shielded by a light shielding film;
a first film which is formed on the effective region and in which at least one layer or more of layers having a negative fixed charge are laminated; and
a second film which is formed on the optical black region and in which at least one layer or more of layers having a negative fixed charge are laminated,
wherein the number of layers formed in the first film is different from the number of layers formed in the second film.

2. The solid-state imaging device according to claim 1, wherein the first film includes,
a first layer that is formed on the semiconductor substrate using an atomic layer vapor deposition method or a metal organic chemical vapor deposition method,
a second layer that is formed on the first layer using the atomic layer vapor deposition method or the metal organic chemical vapor deposition method, and
a third layer that is formed on the second layer using a physical vapor deposition, and
wherein the second film includes,
a first layer that is formed on the semiconductor substrate using the atomic layer vapor deposition method or the metal organic chemical vapor deposition method, and
a second layer that is formed on the first layer using the physical vapor deposition.

3. The solid-state imaging device according to claim 1, wherein the first film includes,
a first layer that is formed on the semiconductor substrate using an atomic layer vapor deposition method or a metal organic chemical vapor deposition method, and
a second layer that is formed on the first layer using a physical vapor deposition, and
wherein the second film includes,
a first layer that is formed on the semiconductor substrate using the atomic layer vapor deposition method or the metal organic chemical vapor deposition method,
a second layer that is formed on the first layer using the physical vapor deposition, and
a third layer that is formed on the second layer using the atomic layer vapor deposition method or the metal organic chemical vapor deposition method.

4. The solid-state imaging device according to claim 1, wherein the first film includes, a first layer that is formed on the semiconductor substrate using an atomic layer vapor deposition method or a metal organic chemical vapor deposition method, a second layer that is formed on the first layer using a physical vapor deposition, and a third layer that is formed on the second layer using the atomic layer vapor deposition method or the metal organic chemical vapor deposition method, and wherein the second film includes, a first layer that is formed on the semiconductor substrate using the atomic layer vapor deposition method or the metal organic chemical vapor deposition method.

5. The solid-state imaging device according to claim 1, wherein the layers making up the first film and the second film are formed of any one of a hafnium oxide film, an aluminum oxide film, a zirconium oxide film, a tantalum oxide film, and a titanium oxide film.

6. An imaging apparatus comprising:

the solid-state imaging device according to claim 1;

an optical system that images an image of a subject on the solid-state imaging device;

a driving unit that generates a driving pulse that allows the solid-state imaging device to operate; and a signal processing circuit that processes an output image signal from the solid-state imaging device.

7. A method of manufacturing a solid-state imaging device, the method comprising:

forming an effective region in which a photodiode performing a photoelectric conversion is formed, and an optical black region shielded by a light shielding film in a semiconductor substrate;

forming a first film, in which at least one layer or more of layers having a negative fixed charge are laminated, on the effective region; and forming a second film, in which at least one layer or more of layers having a negative fixed charge are laminated and the number of layers is different from the number of layers formed in the first film, on the optical black region.

* * * * *